(12) United States Patent
Koyama

(10) Patent No.: US 6,334,789 B1
(45) Date of Patent: Jan. 1, 2002

(54) SURFACE-MOUNT CONNECTOR

(75) Inventor: Ryozo Koyama, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/392,615

(22) Filed: Sep. 9, 1999

(30) Foreign Application Priority Data

Sep. 14, 1998 (JP) .......................................... 10-260516

(51) Int. Cl.$^7$ ........................ H01R 13/60; H01R 13/66
(52) U.S. Cl. ........................................ 439/570; 439/64
(58) Field of Search ............................... 439/570, 571, 439/566, 572, 567, 64, 563, 78, 83

(56) References Cited

U.S. PATENT DOCUMENTS 5,626,482 A * 5/1997 Chan et al. ................. 439/570
5,795,187 A * 8/1998 Sipe ........................... 439/534
5,928,031 A * 7/1999 Chishima .................... 439/570
5,961,347 A * 10/1999 Hsu ............................ 439/570

* cited by examiner

Primary Examiner—Tho D. Ta
Assistant Examiner—Phuong Nguyen
(74) Attorney, Agent, or Firm—Kanesaka & Takeuchi

(57) ABSTRACT

The surface-mount connector includes a fixing metal member (40) for attaching a connector body to a board. The fixing metal member has a securing section (41) to be attached to the connector body and an attaching section (42) to be attached to the board. The connector body is provided with an engaging section (31A) with which the securing section is engaged such that the fixing metal member rotates about the engaging section when the connector body moves relative to the board.

5 Claims, 7 Drawing Sheets

SURFACE-MOUNT CONNECTOR

BACKGROUND OF THE INVENTION

1. Field of the Invention

The present invention relates to surface-mount connectors to be surface-mounted on a printed circuit board or the like.

2. Description of the Related Art

Some surface-mount connectors are attached to a printed circuit board by placing the connection sections of contact terminals and fixing metal members on the corresponding conductor traces and soldering pads of the PCB, respectively, and subjecting them to reflow soldering.

The attaching sections of the fixing metal members are secured to the engaging section of the connector body by press-fitting or the like. This firmly securing method presents the following problem.

FIG. 11 shows a conventional surface-mount connector 10 being surface-mounted on a printed circuit board (PCB)1. The surface-mount connector 10 comprises an insulating connector body 11 and contact terminals 12 provided at a terminal arranging section 11A of the connector body 11. A lock arm 11B is provided at either side of the terminal arranging section 11A to lock a mating connector or printed circuit board. A fixing metal member 13 is provided near the front end of the lock arm 11B. The fixing metal member 13 is secured at one end to the lock arm 11B by press-fit and has at the other end an attaching section 13A to the PCB 1.

Reflow soldering is made under such conditions that the connection sections of the contact terminals 12 and the attaching section 13A of the fixing metal member 13 are put on the corresponding soldering traces. The heat of reflow soldering can deform the mold of the terminal arranging section 11A and the lock arm 11B, and separate the fixing metal member 13 from the PCB 1. Such separation of the fixing metal member 13 is illustrated in FIG. 12. The contact terminals 12 move downwardly owing to the flexure of the mold. When the lock arm 11B is tilted in this way, the fixing metal member 13 secured to the lock arm 11B is lifted up. Consequently, the attaching section 13A of the fixing metal member 13 is separated from the PCB 1 by a distance H, resulting in the poor soldering of the contact terminal 12 and/or the fixing metal member 13 to the PCB 1.

SUMMARY OF THE INVENTION

Accordingly, it is an object of the invention to provide a surface-mount connector capable of solving such a problem as described above.

According to the invention there is provided a surface-mount connector which comprises a connector body having an engaging section; a fixing metal member having an attaching section to a board and a securing section for engagement with the engaging section of the connector body such that when the connector body moves relative to the board, the attaching section is rotatable at the engaging section.

According to one embodiment of the invention, the fixing metal member is made by stamping and bending a metal sheet such that the securing section has a C-shaped form and the attaching section has a flat plate-like form, and the engaging section has a C-shaped groove for receiving the C-shaped securing section.

According to another embodiment of the invention, the fixing metal is provided with a stopper near the attaching section to prevent inward bend of a lock lever of the connector body.

According to still another embodiment of the invention, the fixing metal member is made by stamping and bending a metal sheet so as to provide the securing section with an opening and the attaching section with a flat plate-like form and the engaging section has a pivot for engagement with the opening to permit rotation of the fixing metal member about the pivot.

According to yet another embodiment of the invention, the fixing metal member is made by stamping and bending a metal sheet so as to provide the securing section with a G-shaped form, the attaching section with a flat plate-like form, and the engaging portion has a G-shaped groove for slidably receiving the G-shaped securing section.

According to another embodiment of the invention, the fixing metal member is made from a metal block so as to provide the securing section with a flat plate-like form having a seesaw shaft, the attaching section with a C-shaped form, and the engaging section having a cavity for receiving the securing section for seesaw movement of the fixing metal member.

DESCRIPTION OF THE PREFERRED EMBODIMENTS

Embodiments of the invention will now be described with reference to FIGS. 1–10.

Figure 1:
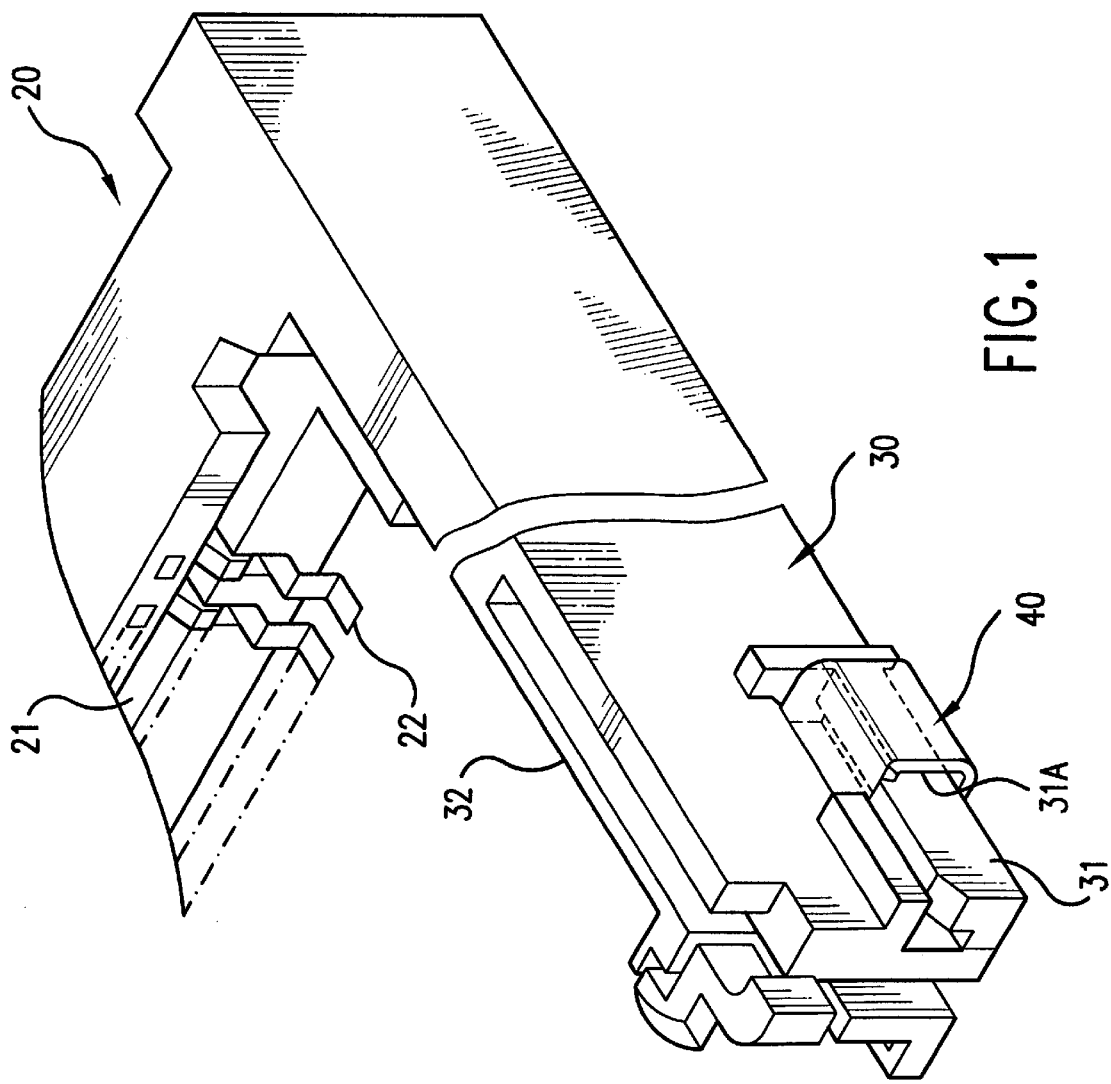
FIG. 1 is a perspective view of a part of a surface-mount connector according to an embodiment of the invention.

In FIG. 1, the surface-mount connector comprises a insulating housing which has terminal arranging section 20 into which a daughter board is to be fitted and an arm section 30 extending forwardly from an end of the terminal arranging section 20 for locking the daughter board. The terminal arranging section 20 has a plurality of terminal arranging slots 21 in which a plurality of contact sections 22 of contact terminals are placed. The arm section 30 has a fixed arm 31 secured to the mother board and a movable arm 32 for locking the daughter board. The terminal arranging section 20, the fixed arm 31, and the movable arm 32 are the same as the conventional ones, and no further description will be provided.

Figure 2:
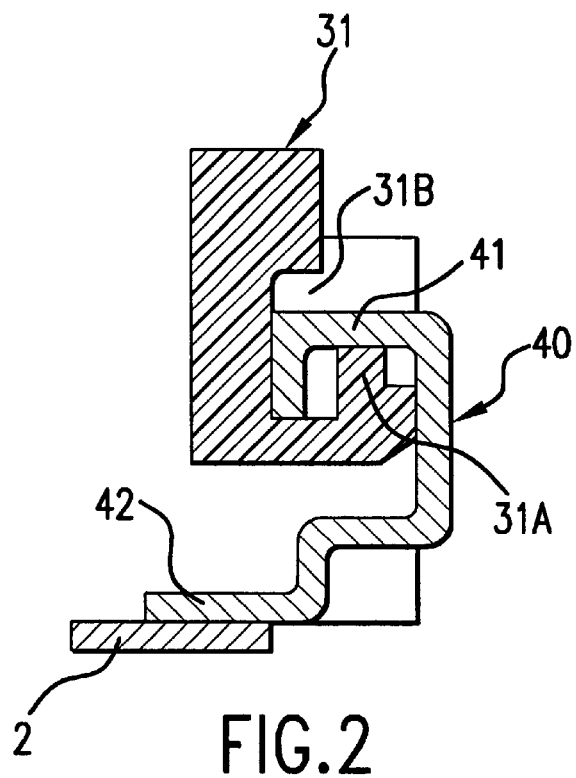
FIG. 2 is a sectional view of a fixing metal member attached to the engaging section of a fixed arm for the surface-mount connector.

According to the invention, the fixed arm 31 has a fixing metal engaging section 31A to which a fixing metal member 40 is attached. As shown in FIG. 2, the fixing metal member 40 is used to secure the fixed arm 31 to the mother board. It is made by stamping and bending a metal sheet such that it has a C-shaped securing section 41 and a flat attaching section 42. The fixing member engaging section 31A has a C-shaped groove 31B for slidably receiving the C-shaped securing section 41 of the fixing metal member 40.

The attaching section 42 of the fixing metal member 40 is placed on a soldering pad 2 of the mother board prior to reflow soldering. After the reflow soldering, under the influence of heat, the mold of the terminal arranging section 20 can be deformed and the front end of the fixed arm 31 can be separated. Since the securing section 41 of the fixing metal member 40 is slidably engaged with the fixing member engaging section 31A of the fixed arm 31, the fixing metal member 40 moves downwardly in proportion as the fixed arm 31 moves upwardly as shown in FIG. 3.

Figure 3:
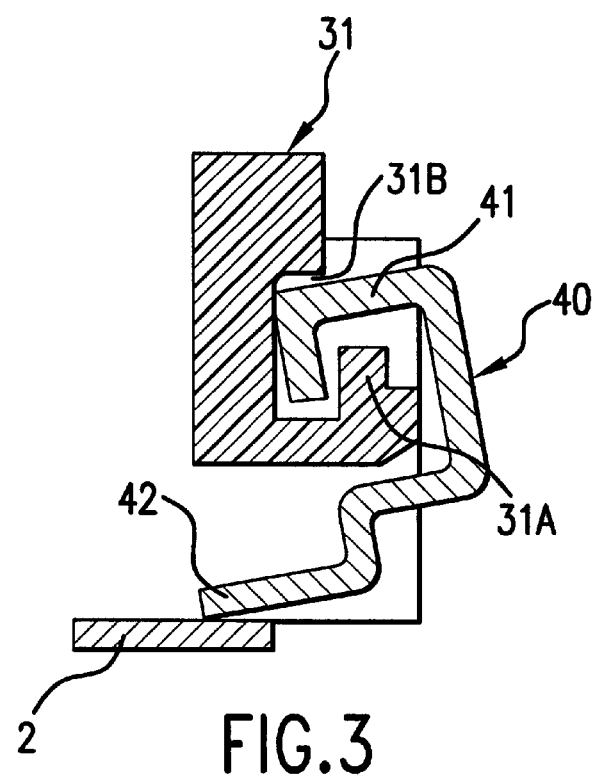
FIG. 3 is a sectional view of the fixing metal member which moves downwardly in proportion as the fixed arm moves upwardly.

In FIG. 3, even if the fixed arm 31 is lifted up slightly, the securing section 41 of the fixing metal member 40 slides on the fixing member engaging section 31A of the fixed arm 31 so that the attaching section 42 can still be connected to the soldering pad 2 of the mother board. Consequently, the attaching section 42 is soldered to the soldering pad 2 without problems. That is, when the front end of the fixed arm is lifted owing to the twisted molding of the connector body, soldering is made without problems because the fixing metal member goes down in proportion as the arm goes up.

Figure 4:
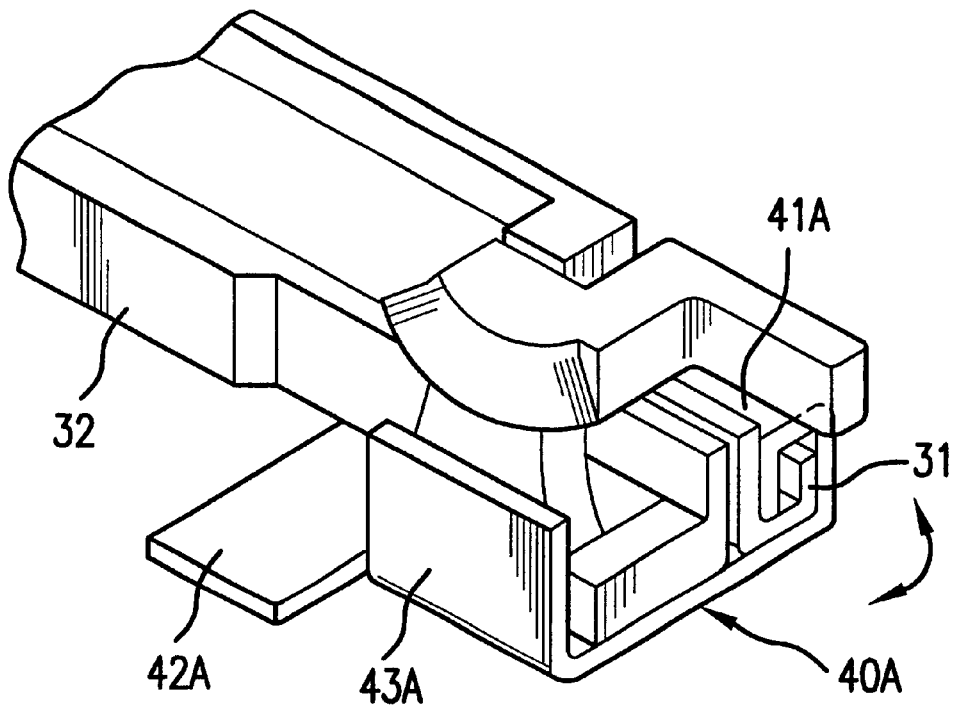
FIG. 4 is a perspective view of an arm section provided with a fixing metal member according to another embodiment of the invention.
Figure 5:
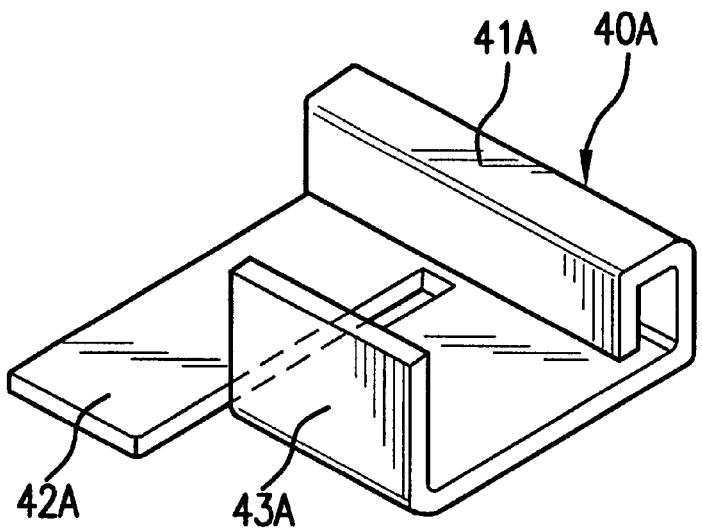
FIG. 5 is a perspective view of the fixing metal member of FIG. 4.

FIG. 4 shows an arm portion of a connector body with a fixing metal member according to another embodiment of the invention. FIG. 5 shows only the fixing metal member.

In FIGS. 4 and 5, a fixing metal member 40A is attached to the fixed arm 31 of a surface-mount connector and has a configuration substantially identical with the fixing metal member 40 of FIGS. 1–3 except that a stopper 43A extends from the C-shaped securing section 41A along the attaching section 42A to prevent the lock lever (movable arm) 32 from bending inwardly. The other functions of the fixing metal member 40A are the same as those of the fixing metal member 40, and the description will be omitted.

Figure 6:
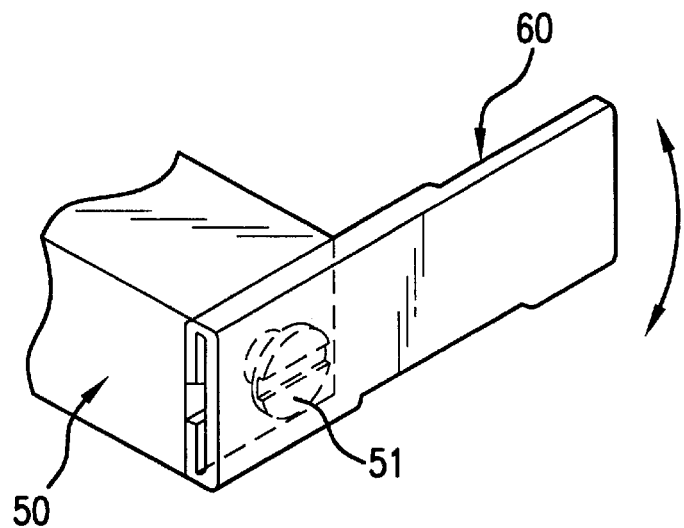
FIG. 6 is a perspective view of a connector body with a fixing metal member according to still another embodiment of the invention.
Figure 7:
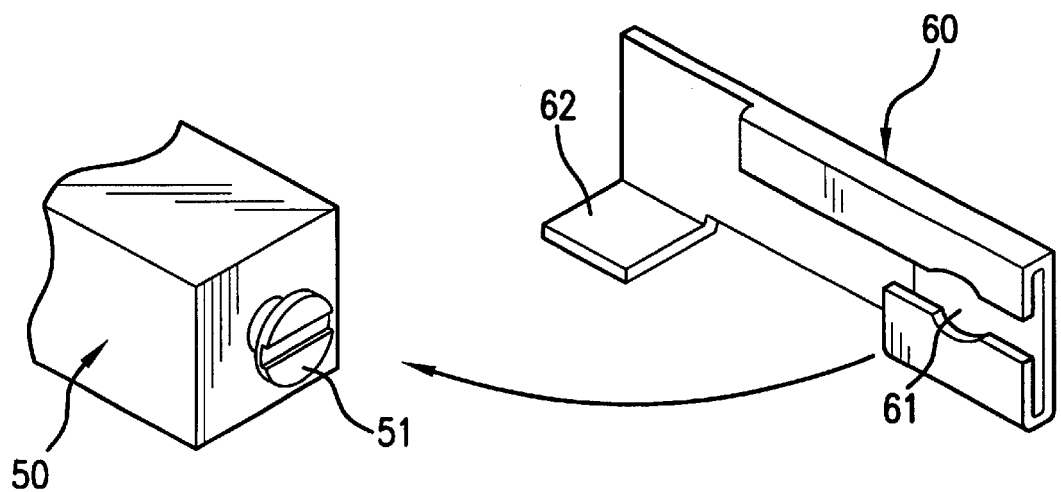
FIG. 7 is a perspective view of the connector body and the fixing metal member prior to attachment.

FIG. 6 shows a portion of a connector body with a fixing metal member according to still another embodiment of the invention. FIG. 7 shows the fixing metal member prior to attachment to the connector body. In FIGS. 6 and 7, a connector body 50 is provided with a pivot 51 for engagement with a fixing metal member 60. The fixing metal member 60 is made by stamping and bending a metal sheet so as to provide a securing opening 61 and an attaching section 62. The fixing metal member 60 is attached to the connector body 50 for rotation about the pivot 51 by engaging the securing opening 61 with the pivot 51 of the connector body 50.

The operation of the fixing metal member 60 is substantially the same as that of the fixing metal member 40. That is, where the end of the connector body 50 is lifted up by twist or warp of the molding, the securing opening 61 attached to the pivot 51 permits the attaching section 62 to move downwardly. Consequently, the attaching section 62 will not be separated from the soldered mother board.

Figure 8:
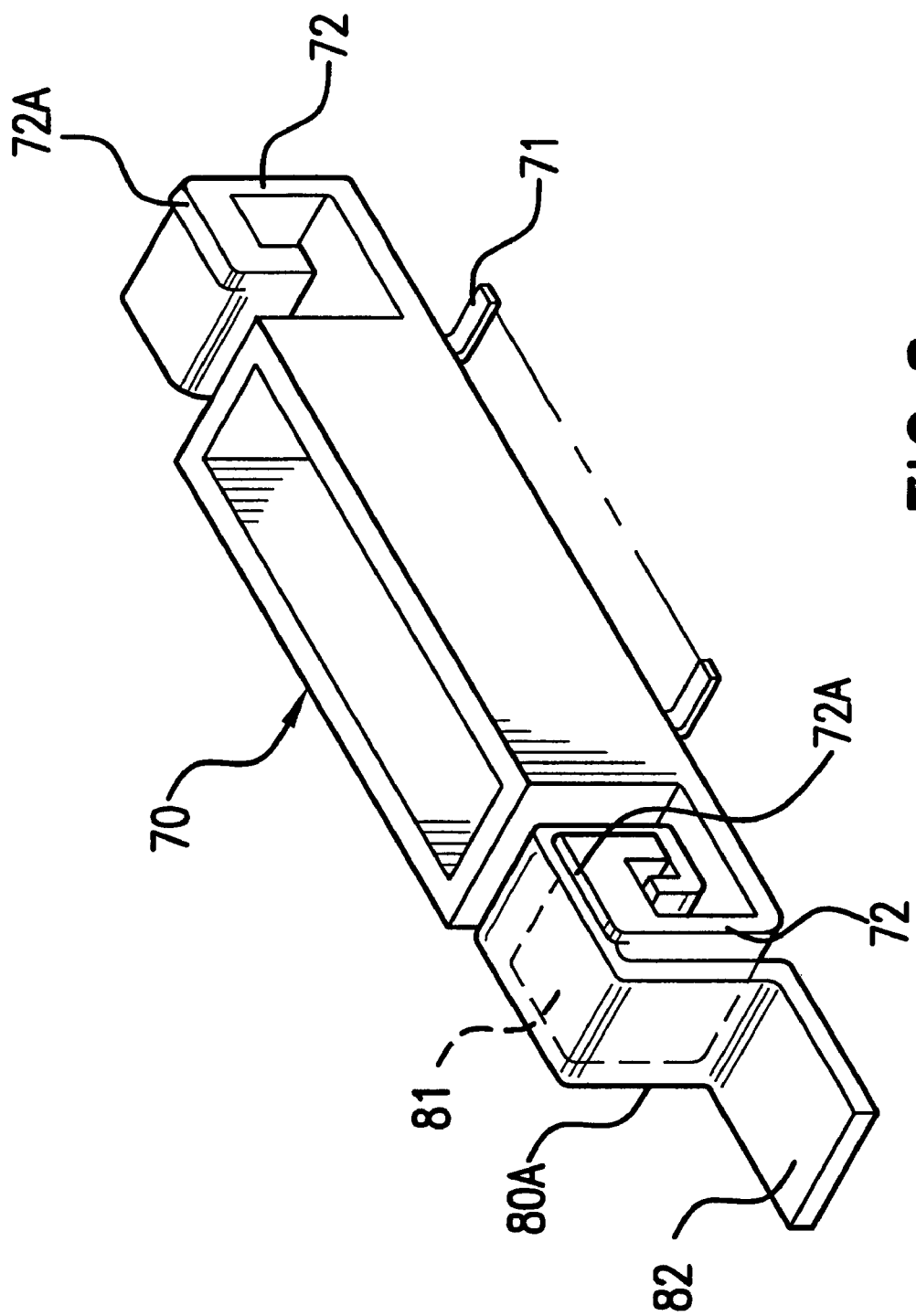
FIG. 8 is a perspective view of a surface-mount connector with a fixing metal member according to yet another embodiment of the invention.

FIG. 8 shows a surface-mount connector with a fixing metal member according to yet another embodiment of the invention. This surface-mount connector is used to interconnect two printed circuit boards in stacking. A plurality of contact terminals 71 are provided in the connector body 70 which is provided with a pair of G-shaped engaging sections 72 for engagement with the fixing metal members 80. A ridge portion 72A is provided on the engaging section 72 to prevent separation of the fixing metal member 80. The fixing metal member 80 is made by stamping and bending a sheet metal so as to provide a G-shaped securing section 81 and a flat attaching section 82.

The operation of the fixing metal member 80 is substantially the same as that of the fixing metal member 40, and the description will be omitted.

Figure 9:
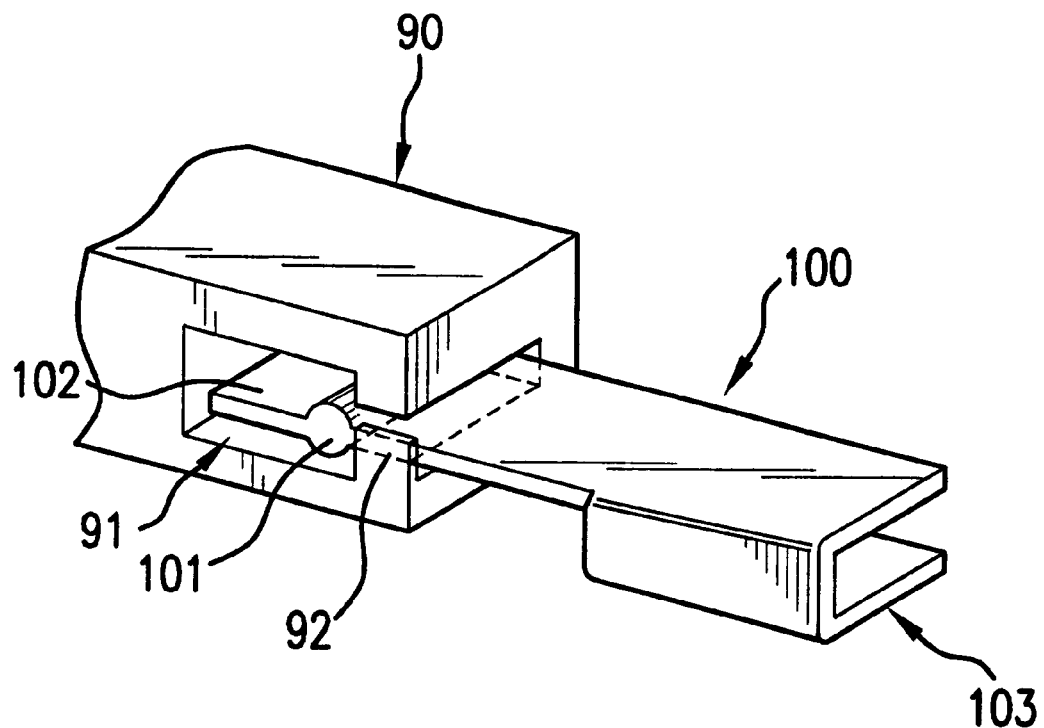
FIG. 9 is a perspective view of a part of a surface-mount connector with a fixing metal member according to another embodiment of the invention.
Figure 10:
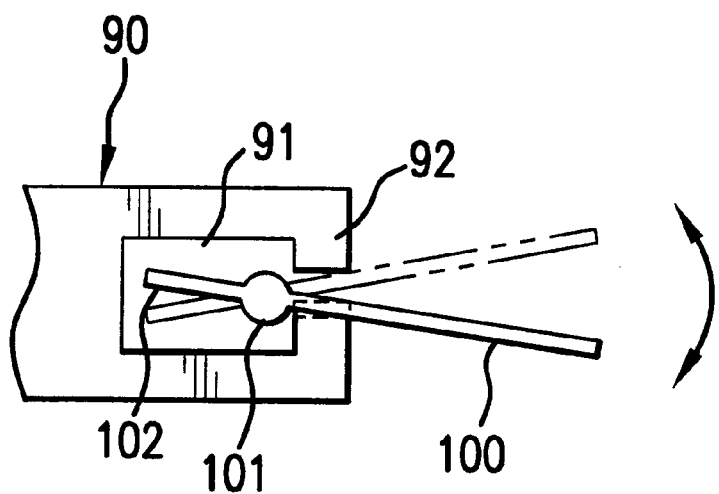
FIG. 10 is a side elevational view of the part of the surface-mount connector.
Figure 11:
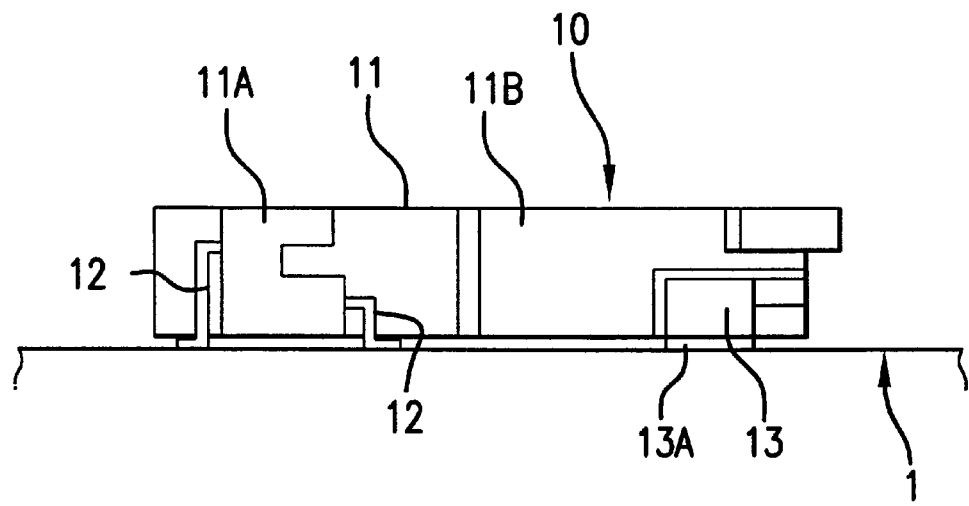
FIG. 11 is a side elevational view of a conventional surface-mount connector mounted on a printed circuit board.
Figure 12:
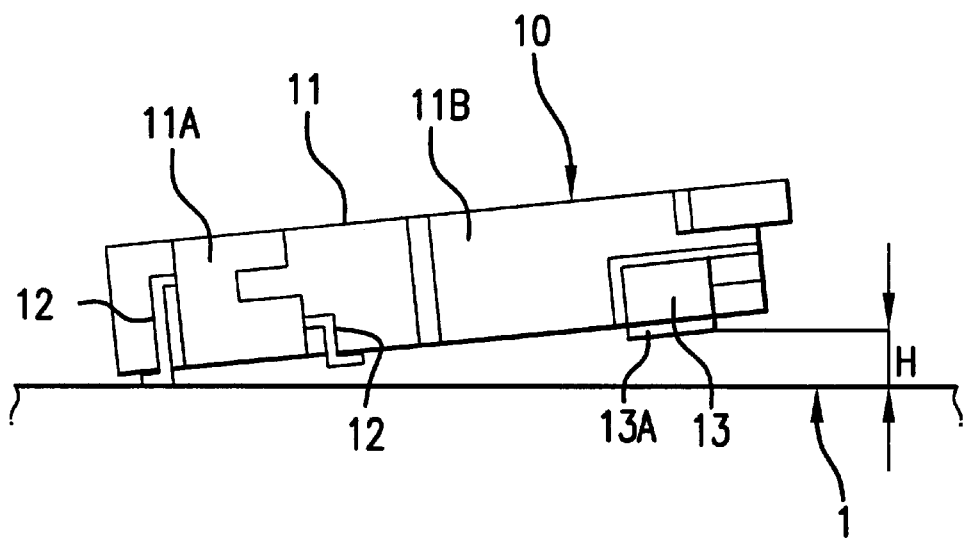
FIG. 12 is a side elevational view of the conventional surface-mount connector separated from the printed circuit board.

FIG. 9 shows a fixed arm of a surface-mount connector with a fixing metal member according to another embodiment of the invention. FIG. 10 shows the fixing metal member in action. A cavity 91 is provided at the front end of a fixed arm 90 and has a protruded edge 92 to prevent separation of the fixing metal member 100. The fixing metal member 100 is made from a metallic material so as to provide a flat securing section 102 with a seesaw shaft 101 and a C-shaped attaching section 103. As best shown in FIG. 10, the fixing metal member 100 is attached to the fixed arm by movably fitting the attaching section 102 into the cavity 91 so that the fixing metal member 100 is movable like seesaw.

The operation of the fixing metal member 100 is substantially the same as that of the fixing metal member 40. That is, where the end of the fixed arm 90 is lifted up from the mother board by the twisted or warped molding, the securing section 102 of the fixing metal member 100 is movable like seesaw at the seesaw shaft 101 within the cavity 91 to permit downward movement of the attaching section 103. Thus, the attaching section 103 is not separated from the soldering area.

When the surface-mount connector is mounted on a mother board, poor or defective soldering is avoided. Since the fixing metal member is movable relative to the connector body, the manufacturing tolerance and deformation of the molding are absorbed by the movement of the fixing metal member. Accordingly, it is not necessary to raise the precision of the molding, resulting in the reduced manufacturing cost.

What is claimed is:

1. A surface-mount connector comprising:
    a connector body having an engaging section;
    a fixing metal member having an attaching section to a board and a securing section for engagement with said engaging section of said connector body and such that when said connector body moves relative to said board, said securing section is rotatable at said engaging section, wherein said fixing metal member is made by stamping and bending a metal sheet such that said securing section has a C-shaped form and said attaching section has a flat plate-like form, and said engaging section has a C-shaped groove for receiving said C-shape securing section, and said fixing metal member is provided with a stopper near said attaching section to prevent inward bend of a lock lever of said connector body.

2. A surface-mount connector comprising:
    a connector body having an engaging section;

a fixing metal member having an attaching section to a board and a securing section for engagement with said engaging section of said connector body and such that when said connector body moves relative to said board, said securing section is rotatable at said engaging section, wherein said fixing metal member is made by stamping and bending a metal sheet so as to provide said securing section with an opening and said attaching section with a flat plate-like form and said engaging section has a pivotal shaft for engagement with said opening to permit rotation of said securing section.

3. A surface-mount connector comprising:

a connector body having an engaging section;

a fixing metal member having an attaching section to a board and a securing section for engagement with said engaging section of said connector body and such that when said connector body moves relative to said board, said securing section is rotatable at said engaging section, wherein said fixing metal member is made from a metal block so as to provide said securing section with a flat plate-like form having a seesaw shaft, said attaching section with a C-shaped form, and said engaging section having a cavity for receiving said securing section for seesaw movement.

4. A surface-mount connector comprising:

a connector body with an engaging section having a C-shaped groove; and a fixing metal member having an attaching section having a flat plate-like form and soldered to a board and a securing section having a C-shaped form for engagement with said C-shaped groove of said engaging section of said connector body such that when said connector body moves relative to said board, said securing section is slidable on and rotatable at said engaging section, thus securing firm connection of said attaching section to said board.

5. A surface-mount connector comprising:

a connector body with an engaging section having a G-shaped groove; and a fixing metal member having an attaching section having a flat plate-like form and soldered to a board and a securing section having a G-shaped form for engagement with said G-shaped groove of said engaging section of said connector body such that when said connector body moves relative to said board, said securing section is slidable on and rotatable at said engaging section, thus securing firm connection of said attaching section to said board.

* * * * *